(12) United States Patent
Chang et al.

(10) Patent No.: US 7,658,970 B2
(45) Date of Patent: *Feb. 9, 2010

(54) NOBLE METAL LAYER FORMATION FOR COPPER FILM DEPOSITION

(76) Inventors: Mei Chang, 12881 Corte de Arguello, Saratoga, CA (US) 95070; Ling Chen, 784 Dartshire Way, Sunnyvale, CA (US) 94087

( * ) Notice: Subject to any disclaimer, the term of this patent is extended or adjusted under 35 U.S.C. 154(b) by 0 days.

This patent is subject to a terminal disclaimer.

(21) Appl. No.: 12/170,454

(22) Filed: Jul. 10, 2008

(65) Prior Publication Data

US 2008/0274279 A1 Nov. 6, 2008

Related U.S. Application Data

(63) Continuation of application No. 10/443,648, filed on May 22, 2003, now Pat. No. 7,404,985.

(60) Provisional application No. 60/385,499, filed on Jun. 4, 2002.

(51) Int. Cl.
*C23C 16/00* (2006.01)
(52) U.S. Cl. ............... 427/248.1; 427/255.23; 427/255.7
(58) Field of Classification Search .................. None
See application file for complete search history.

(56) References Cited

U.S. PATENT DOCUMENTS

| | | | |
|---|---|---|---|
| 5,372,849 A | 12/1994 | McCormick et al. | |
| 5,933,753 A | 8/1999 | Simon et al. | |
| 5,962,716 A | 10/1999 | Uhlenbrock et al. | |
| 6,063,705 A | 5/2000 | Vaartstra | |
| 6,074,945 A | 6/2000 | Vaartstra et al. | |
| 6,114,557 A | 9/2000 | Uhlenbrock et al. | |
| 6,203,613 B1 | 3/2001 | Gates et al. | |
| 6,294,836 B1 | 9/2001 | Paranjpe et al. | |
| 6,338,991 B1 | 1/2002 | Zhang et al. | |

(Continued)

FOREIGN PATENT DOCUMENTS

EP 1293509 3/2003

(Continued)

OTHER PUBLICATIONS

Rhee et al. Cobalt metallorganic chemical vapor deposition and formation of epitaxiial CoSi2 layer on Si(100) substrate, 1999, J. Electrochem. Soc. 146(7), abstract.*

(Continued)

*Primary Examiner*—Timothy Meeks
*Assistant Examiner*—Kelly M Gambetta
(74) *Attorney, Agent, or Firm*—Patterson & Sheridan, LLP

(57) ABSTRACT

Embodiments described herein relate to depositing a cobalt-containing layer by a cyclical deposition process while forming interconnects on a substrate. In one embodiment, a method for forming an interconnect structure is provided which includes depositing a tungsten-containing barrier layer over an exposed contact metal surface within an aperture formed in an insulating material disposed on a substrate, forming a cobalt-containing layer on the tungsten-containing barrier layer using a cyclical deposition process by sequentially exposing the substrate to a cobalt precursor gas and a silicon reducing gas, wherein the cobalt precursor gas contains a cobalt precursor having a cyclopentadienyl ligand, and depositing a copper material on the cobalt-containing layer.

19 Claims, 4 Drawing Sheets

U.S. PATENT DOCUMENTS

| | | | |
|---|---|---|---|
| 6,346,477 B1 | 2/2002 | Kaloyeros et al. | |
| 6,365,502 B1 | 4/2002 | Paranjpe et al. | |
| 6,372,598 B2 | 4/2002 | Kang et al. | |
| 6,423,619 B1 | 7/2002 | Grant et al. | |
| 6,440,495 B1 | 8/2002 | Wade et al. | |
| 6,462,367 B2 | 10/2002 | Marsh et al. | |
| 6,479,100 B2 | 11/2002 | Jin et al. | |
| 6,482,740 B2 | 11/2002 | Soininen et al. | |
| 6,517,616 B2 | 2/2003 | Marsh et al. | |
| 6,527,855 B2 * | 3/2003 | DelaRosa et al. | 117/89 |
| 6,541,067 B1 | 4/2003 | Marsh et al. | |
| 6,576,778 B1 | 6/2003 | Uhlenbrock et al. | |
| 6,580,111 B2 | 6/2003 | Kim et al. | |
| 6,596,602 B2 | 7/2003 | Iizuka et al. | |
| 6,597,029 B2 | 7/2003 | Kim et al. | |
| 6,605,735 B2 | 8/2003 | Kawano et al. | |
| 6,610,568 B2 | 8/2003 | Marsh et al. | |
| 6,617,634 B2 | 9/2003 | Marsh et al. | |
| 6,627,995 B2 | 9/2003 | Paranjpe et al. | |
| 6,645,847 B2 | 11/2003 | Paranjpe et al. | |
| 6,713,373 B1 | 3/2004 | Omstead | |
| 6,737,317 B2 | 5/2004 | Marsh et al. | |
| 6,743,739 B2 | 6/2004 | Shimamoto et al. | |
| 6,744,138 B2 | 6/2004 | Marsh | |
| 6,780,758 B1 | 8/2004 | Derderian et al. | |
| 6,790,773 B1 | 9/2004 | Drewery et al. | |
| 6,800,542 B2 | 10/2004 | Kim et al. | |
| 6,800,548 B2 | 10/2004 | Andideh | |
| 6,800,937 B2 | 10/2004 | Marsh et al. | |
| 6,812,126 B1 | 11/2004 | Paranjpe et al. | |
| 6,824,665 B2 | 11/2004 | Shelnut et al. | |
| 6,824,816 B2 | 11/2004 | Aaltonen et al. | |
| 6,861,356 B2 | 3/2005 | Matsuse et al. | |
| 6,887,795 B2 | 5/2005 | Soininen et al. | |
| 6,893,915 B2 | 5/2005 | Park et al. | |
| 7,005,697 B2 | 2/2006 | Batra et al. | |
| 7,008,872 B2 * | 3/2006 | Dubin et al. | 438/678 |
| 7,264,846 B2 | 9/2007 | Chang et al. | |
| 7,265,048 B2 | 9/2007 | Chung et al. | |
| 7,404,985 B2 | 7/2008 | Chang et al. | |
| 7,429,402 B2 | 9/2008 | Gandikota et al. | |
| 7,446,032 B2 | 11/2008 | Kailasam | |
| 7,473,634 B2 | 1/2009 | Suzuki | |
| 2001/0006838 A1 | 7/2001 | Won et al. | |
| 2001/0054730 A1 | 12/2001 | Kim et al. | |
| 2002/0000587 A1 | 1/2002 | Kim et al. | |
| 2002/0004293 A1 | 1/2002 | Soininen et al. | |
| 2002/0025627 A1 | 2/2002 | Marsh et al. | |
| 2002/0028556 A1 | 3/2002 | Marsh et al. | |
| 2002/0074577 A1 | 6/2002 | Marsh et al. | |
| 2002/0076837 A1 | 6/2002 | Hujanen et al. | |
| 2002/0076881 A1 | 6/2002 | Marsh et al. | |
| 2002/0081381 A1 | 6/2002 | DelaRosa et al. | |
| 2002/0102810 A1 | 8/2002 | Iizuka et al. | |
| 2002/0102838 A1 | 8/2002 | Paranjpe et al. | |
| 2002/0121697 A1 | 9/2002 | Marsh | |
| 2002/0125516 A1 | 9/2002 | Marsh et al. | |
| 2002/0137332 A1 | 9/2002 | Paranjpe et al. | |
| 2002/0173054 A1 | 11/2002 | Kim | |
| 2002/0197856 A1 | 12/2002 | Matsuse et al. | |
| 2003/0096468 A1 | 5/2003 | Soininen et al. | |
| 2003/0165615 A1 | 9/2003 | Aaltonen et al. | |
| 2003/0212285 A1 | 11/2003 | Uhlenbrock et al. | |
| 2004/0005753 A1 | 1/2004 | Kostamo et al. | |
| 2004/0038529 A1 | 2/2004 | Soininen et al. | |
| 2004/0105934 A1 | 6/2004 | Chang et al. | |
| 2004/0108217 A1 | 6/2004 | Dubin | |
| 2004/0211665 A1 | 10/2004 | Yoon et al. | |
| 2004/0214354 A1 | 10/2004 | Marsh et al. | |
| 2004/0241321 A1 | 12/2004 | Ganguli et al. | |
| 2005/0006799 A1 | 1/2005 | Gregg et al. | |
| 2005/0081882 A1 | 4/2005 | Greer et al. | |
| 2005/0085031 A1 | 4/2005 | Lopatin et al. | |
| 2005/0124154 A1 | 6/2005 | Park et al. | |
| 2005/0238808 A1 | 10/2005 | Gatineau et al. | |
| 2006/0019494 A1 | 1/2006 | Cao et al. | |
| 2006/0128150 A1 | 6/2006 | Gandikota et al. | |
| 2006/0153973 A1 | 7/2006 | Chang et al. | |
| 2006/0199372 A1 | 9/2006 | Chung et al. | |
| 2007/0054487 A1 | 3/2007 | Ma et al. | |
| 2007/0077750 A1 | 4/2007 | Ma et al. | |
| 2007/0099422 A1 | 5/2007 | Wijekoon et al. | |
| 2007/0119370 A1 | 5/2007 | Ma et al. | |
| 2007/0119371 A1 | 5/2007 | Ma et al. | |
| 2007/0128862 A1 | 6/2007 | Ma et al. | |
| 2007/0128863 A1 | 6/2007 | Ma et al. | |
| 2007/0128864 A1 | 6/2007 | Ma et al. | |
| 2007/0235059 A1 | 10/2007 | Chu et al. | |
| 2008/0135914 A1 | 6/2008 | Krishna et al. | |
| 2008/0274279 A1 | 11/2008 | Chang et al. | |

FOREIGN PATENT DOCUMENTS

| | | |
|---|---|---|
| JP | 2001111000 | 4/2001 |
| JP | 2001237400 | 8/2001 |
| WO | WO-0188972 | 11/2001 |
| WO | WO-0245167 | 6/2002 |
| WO | WO-03056612 | 7/2003 |
| WO | WO-2005020317 | 3/2005 |

OTHER PUBLICATIONS

Aaltonen "Atomic Layer Deposition of Noble Metal Thin Films," Academic Dissertation presented at the Department of Chemistry of the University of Helsinki on Apr. 8, 2005, Helsinki, Finland, pp. 1-71.

Aaltonen, et al. "Atomic Layer Deposition of Ruthenium from $RuCp_2$ and Oxygen: Film Growth and Reaction Mechanism Studies," Electrochemical Society Proceedings, vol. 2003-08, pp. 946-953.

Aaltonen, et al. "Atomic Layer Deposition of Ruthenium Thin Films from $Ru(thd)_3$ and Oxygen," Chem. Vap. Deposition (2004), 10, No. 4, pp. 215-219.

Aaltonen, et al. "Ruthenium Thin Films Grown by Atomic Layer Deposition," Chem. Vap. Deposition (2003), 9, No. 1, pp. 45-49.

Aoyama, et al. "Ruthenium Films Prepared by Liquid Source Chemical Vapor Deposition Using Bis-(ethylcyclopentadienyl)ruthenium," Jpn. J. Appl. Phys. vol. 38 (1999), pp. L1134-L1136.

Bijpost, et al. "Early transition metal catalyzed-hydroboration of alkenes" J. Mol. Cat. A, 1995, asbstract.

Dadgar, et al. "Growth of Ru doped semi-insulating InP by low pressure metalorganic chemical vapor deposition," Journal of Crystal Growth 195 (1998), pp. 69-73.

Dadgar, et al. "Ruthenium: A superior compensator of InP," Applied Physics Letters, vol. 73, No. 26, Dec. 28, 1998, American Institute of Physics, pp. 3878-3880.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606-1608.

Goswami, et al. Transition Metals Show Promise as Copper Barriers, Semiconductor International, ATMI, San Jose—May 1, 2004.

International Search Report dated Mar. 11, 2005 regarding International Application No. PCT/US2004/024805.

Kwon, et al. "Atomic Layer Deposition of Ruthenium Thin Films for Copper Glue Layer," Journal of the Electrochemical Society, 151 (2) (2004), pp. G109-G112.

Kwon, et al. "PEALD of a Ruthenium Adhesion Layer for Copper Interconnects," Journal of the Electrochemical Society, 151 (12) (2004), pp. C753-C756.

Kwon, et al. "Plasma-Enhanced Atomic Layer Deposition of Ruthenium Thin Films," Electrochemical and Solid-State Letters, 7 (4) (2004), pp. C46-C48.

Lashdaf, et al. "Deposition of palladium and ruthenium β-diketonates on alumina and silica supports in gas and liquid phase," Applied Catalysis A: General 241 (2003), pp. 51-63.

Lim, et al. "Atomic layer deposition of transition metals," Nature Materials, vol. 2, Nov. 2003, pp. 749-754.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Shibutami, et al. "A Novel Ruthenium Precursor for MOCVD without Seed Ruthenium Layer," TOSOH Research & Technology Review, vol. 47 (2003), pp. 61-64.

Sun, et al. "Properties of Ru Thin Films Fabricated on TiN by Metal-Organic Chemical Vapor Deposition," Japanese Journal of Applied Physics, vol. 43, No. 4A, 2004, The Japan Society of Applied Physics, pp. 1566-1570.

Final Office Action for U.S. Appl. No. 11/336,527 dated Mar. 20, 2009.

* cited by examiner

US 7,658,970 B2

NOBLE METAL LAYER FORMATION FOR COPPER FILM DEPOSITION

CROSS-REFERENCE TO RELATED APPLICATIONS

This application is a continuation of U.S. Ser. No. 10/443,648 (APPM/005975), filed May 22, 2003 now U.S. Pat. No. 7,404,985, which claims benefit of U.S. Ser. No. 60/385,499 (APPM/005975L), filed Jun. 4, 2002, which are herein incorporated by reference in their entirety.

BACKGROUND OF THE INVENTION

1. Field of the Invention

Embodiments of the present invention generally relate to a method of noble metal layer formation and, more particularly to a method of noble metal layer formation for copper film deposition.

2. Description of the Related Art

Sub-quarter micron, multi-level metallization is one of the key technologies for the next generation of very large scale integration (VLSI) and ultra large scale integration (ULSI) semiconductor devices. The multilevel interconnects that lie at the heart of this technology require the filling of contacts, vias, lines, and other features formed in high aspect ratio apertures. Reliable formation of these features is very important to the success of both VLSI and ULSI as well as to the continued effort to increase client density and quality on individual substrates and die.

As circuit densities increase, the widths of contacts, vias, lines and other features, as well as the dielectric materials between them may decrease to less than about 250 nm (nanometers), whereas the thickness of the dielectric layers remains substantially constant with the result that the aspect ratios for the features, i.e., their height divided by width, increases. Many conventional deposition processes have difficulty filling structures where the aspect ratio exceeds 6:1, and particularly where the aspect ratio exceeds 10:1. As such, there is a great amount of ongoing effort being directed at the formation of void-free, nanometer-sized structures having aspect ratios wherein the ratio of feature height to feature width can be 6:1 or higher.

Additionally, as the feature widths decrease, the device current typically remains constant or increases, which results in an increased current density for such feature. Elemental aluminum and its alloys have been the traditional metals used to form vias and lines in semiconductor devices because of aluminum's perceived low electrical resistivity, its superior adhesion to most dielectric materials, its ease of patterning, and the ability to obtain it in a highly pure form. However, aluminum has a higher electrical resistivity than other more conductive metals such as copper, and aluminum can also suffer from electromigration leading to the formation of voids in the conductor.

Copper and its alloys have lower resistivities than aluminum, as well as a significantly higher electromigration resistance compared to aluminum. These characteristics are important for supporting the higher current densities experienced at high levels of integration and increased device speed. Copper also has good thermal conductivity. Therefore, copper is becoming a choice metal for filling sub-quarter micron, high aspect ratio interconnect features on semiconductor substrates.

A thin film of a noble metal such as, for example, palladium, platinum, cobalt, nickel, and rhodium, among others may be used as an underlayer for the copper vias and lines. Such noble metals, which are resistant to corrosion and oxidation, may provide a smooth surface upon which a copper seed layer is subsequently deposited using for example, an electrochemical plating (ECP) process.

The noble metal is typically deposited using a chemical vapor deposition (CVD) process or a physical vapor deposition (PVD) process. Unfortunately, noble metals deposited on high aspect ratio interconnect features using CVD and/or PVD processes generally have poor step coverage (e.g., deposition of a non-continuous material layer). The poor step coverage for the noble metal material layer may cause the subsequent copper seed layer deposition using an ECP process to be non-uniform.

Therefore, a need exists in the art for a method of depositing noble metals in high aspect ratio interconnect features having good step coverage.

SUMMARY OF THE INVENTION

A method of noble metal layer formation for high aspect ratio interconnect features is described. The noble metal layer is formed using a cyclical deposition process. The cyclical deposition process comprises alternately adsorbing a noble metal-containing precursor and a reducing gas on a substrate structure. The adsorbed noble metal-containing precursor reacts with the adsorbed reducing gas to form the noble metal layer on the substrate. Suitable noble metals may include, for example, palladium, platinum, cobalt, nickel, and rhodium, among others.

The noble metal layer formation is compatible with integrated circuit fabrication processes. In one integrated circuit fabrication process, the noble metal layer may be used as an underlayer for a copper seed layer in a copper interconnect. For such an embodiment, a preferred process sequence includes providing a substrate having an interconnect pattern defined in one or more dielectric layers formed thereon. The interconnect pattern includes a barrier layer conformably deposited thereon. A noble metal layer is conformably deposited on the barrier layer. The noble metal layer is deposited using a cyclical deposition process by alternately adsorbing a noble metal-containing layer and a reducing gas on the substrate. Thereafter, the copper interconnect is completed by depositing a copper seed layer on the noble metal layer and than filling the interconnects with bulk copper metal.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
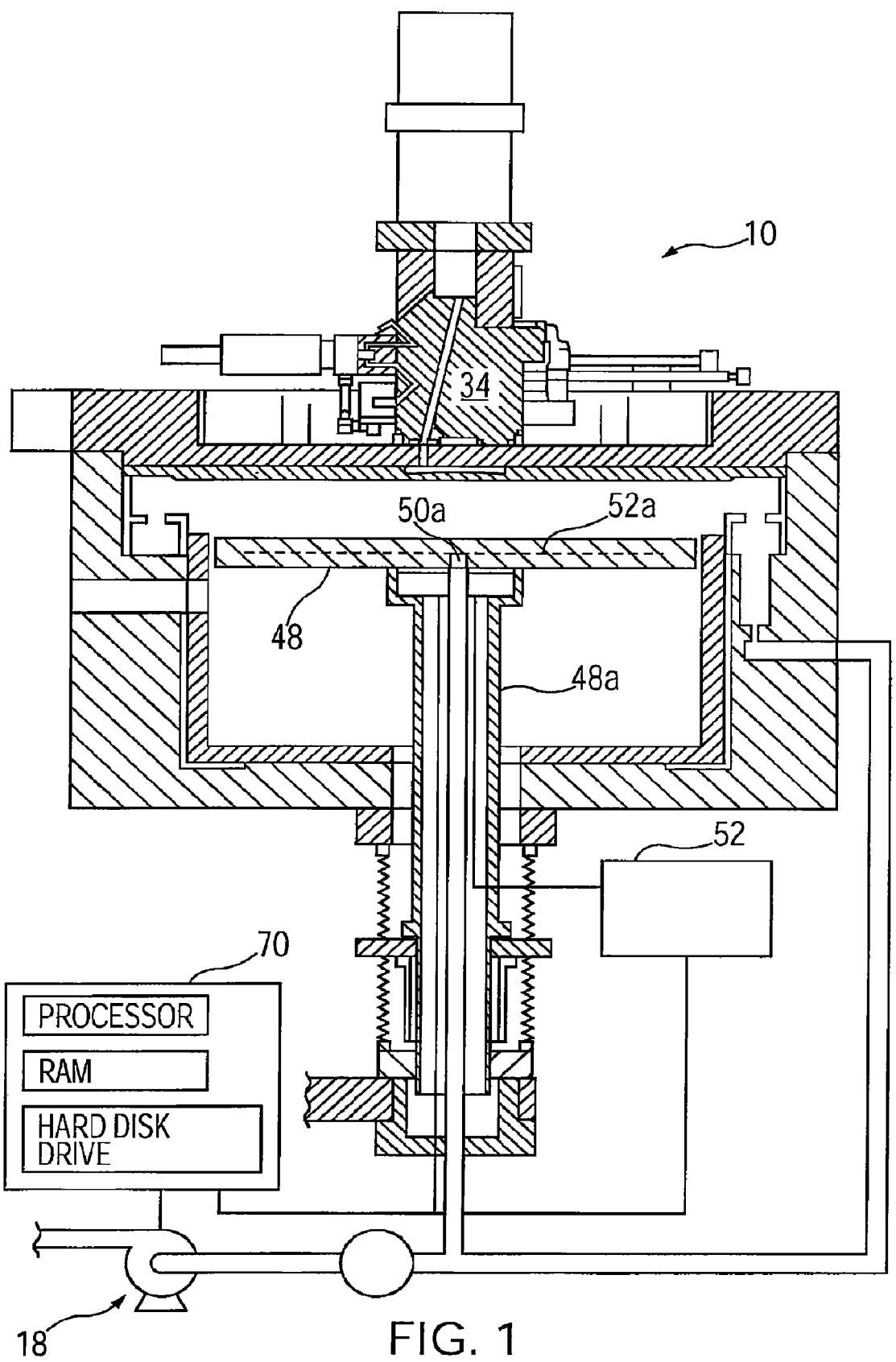
FIG. 1 depicts a schematic cross-sectional view of a process chamber that can be used to perform a cyclical deposition process described herein.

FIG. 1 depicts a schematic cross-sectional view of a process chamber 10 that can be used to perform integrated circuit fabrication in accordance with embodiments described herein. The process chamber 10 generally houses a substrate support pedestal 48, which is used to support a substrate (not shown). The substrate support pedestal 48 is movable in a vertical direction inside the process chamber 10 using a displacement mechanism 48a.

Depending on the specific process, the substrate can be heated to some desired temperature prior to or during deposition. For example, the substrate support pedestal 48 may be heated using an embedded heater element 52a. The substrate support pedestal 48 may be resistively heated by applying an electric current from an AC power supply 52 to the heater element 52a. The substrate (not shown) is, in turn, heated by the pedestal 48. Alternatively, the substrate support pedestal 48 may be heated using radiant heaters such as, for example, lamps (not shown).

A temperature sensor 50a, such as a thermocouple, is also embedded in the substrate support pedestal 48 to monitor the temperature of the pedestal 48 in a conventional manner. The measured temperature is used in a feedback loop to control the AC power supply 52 for the heating element 52a, such that the substrate temperature can be maintained or controlled at a desired temperature which is suitable for the particular process application.

A vacuum pump 18 is used to evacuate the process chamber 10 and to maintain the pressure inside the process chamber 10. A gas manifold 34, through which process gases are introduced into the process chamber 10, is located above the substrate support pedestal 48. The gas manifold 34 is connected to a gas panel (not shown), which controls and supplies various process gases to the process chamber 10.

Proper control and regulation of the gas flows to the gas manifold 34 are performed by mass flow controllers (not shown) and a microprocessor controller, 70. The gas manifold 34 allows process gases to be introduced and uniformly distributed in the process chamber 10. Additionally, the gas manifold 34 may optionally be heated to prevent condensation of any reactive gases within the manifold.

The gas manifold 34 includes a plurality of electronic control valves (not shown). The electronic control valves as used herein refer to any control valve capable of providing rapid and precise gas flow to the process chamber 10 with valve open and close cycles of less than about 1-2 seconds, and more preferably less than about 0.1 second.

The microprocessor controller 70 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required, may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Noble Metal Layer Formation

A method of noble metal layer formation for high aspect ratio interconnect features is described. The noble metal layer is deposited using a cyclical deposition process. The cyclical deposition process comprises alternately adsorbing a noble metal-containing precursor and a reducing gas on a substrate structure. The noble metal-containing precursor and the reducing gas undergo a reaction to form the noble metal layer on the substrate. Suitable noble metals may include for example, palladium, platinum, cobalt, nickel, and rhodium, among others.

Figure 2:
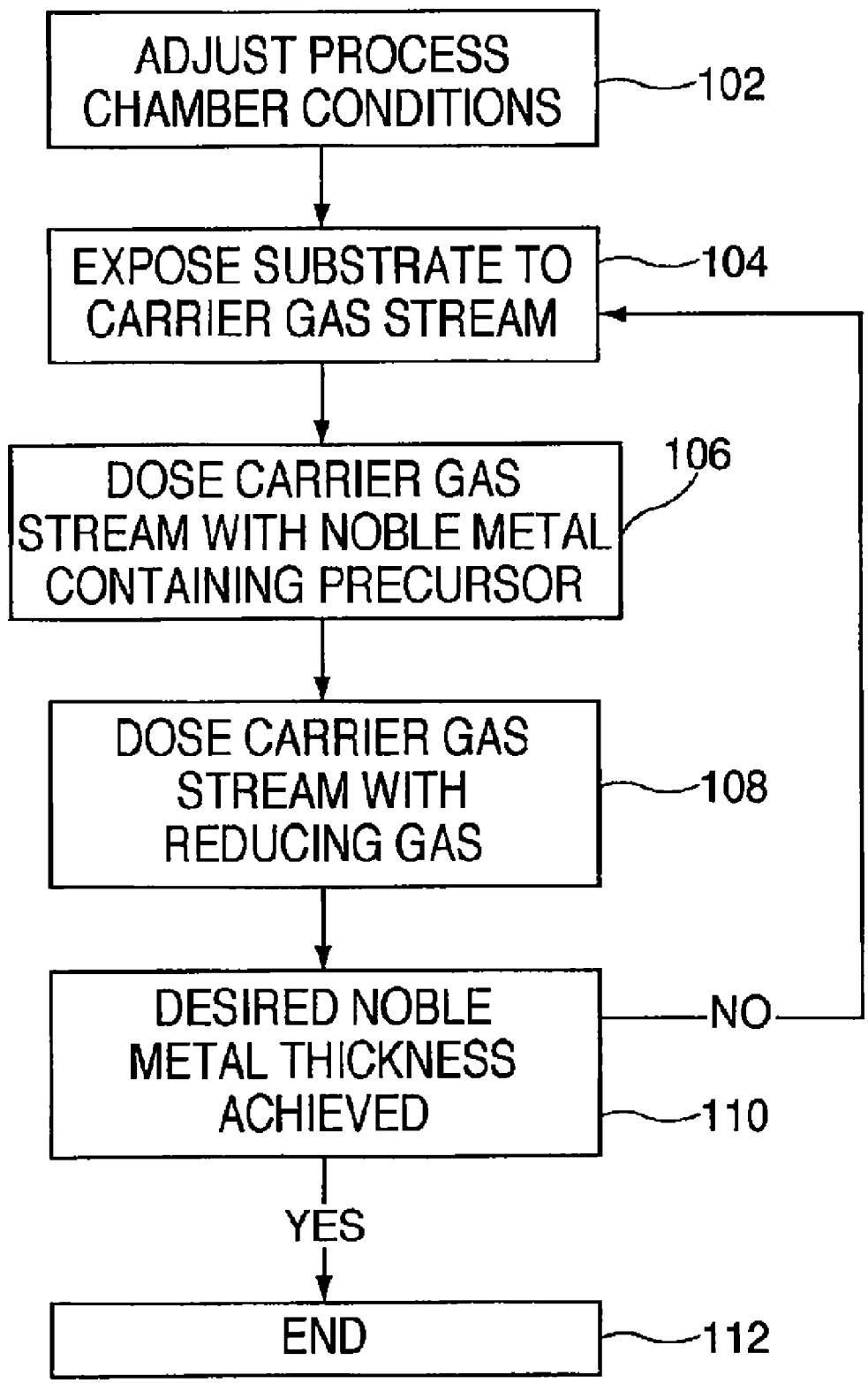
FIG. 2 illustrates a process sequence for noble metal layer formation using cyclical deposition techniques according to one embodiment described herein.

FIG. 2 illustrates a process sequence 100 detailing the various steps used for the deposition of the silicon layer. These steps may be performed in a process chamber similar to that described above with reference to FIG. 1. As shown in step 102, a substrate is provided to the process chamber. The substrate may be for example, a silicon substrate having an interconnect pattern defined in one or more dielectric material layers formed thereon. The process chamber conditions such as, for example, the temperature and pressure are adjusted to enhance the adsorption of the process gases on the substrate so as to facilitate the reaction of the noble-metal-containing precursor and the reducing gas. In general, for noble metal layer deposition, the substrate should be maintained at a temperature less than about 300° C. at a process chamber pressure of between about 1 Torr to about 10 Torr.

In one embodiment where a constant carrier gas flow is desired, a carrier gas stream is established within the process chamber as indicated in step 104. Carrier gases may be selected so as to also act as a purge gas for the removal of volatile reactants and/or by-products from the process chamber. Carrier gases such as, for example, helium and argon, and combinations thereof, among others may be used.

Referring to step 106, after the carrier gas stream is established within the process chamber, a pulse of a noble metal-containing precursor is added to the carrier gas stream. The term pulse as used herein refers to a dose of material injected into the process chamber or into the carrier gas stream. The pulse of the noble metal-containing precursor lasts for a predetermined time interval.

The noble metal-containing precursor may comprise, for example, noble metals such as palladium, platinum, cobalt, nickel, and rhodium, among others. Suitable palladium-containing precursors include bis(allyl) palladium, bis(2-methylallyl) palladium, and cyclopentadienyl (allyl) palladium, among others. Suitable platinum-containing precursors include trimethyl (cyclopentadienyl) platinum, trimethyl (methylcyclopentadienyl) platinum, cyclopentadienyl (allyl) platinum, dimethyl (cyclooctadiene) platinum, methyl carbonyl cyclopentadienyl platinum, trimethyl (acetylacetonato) platinum, and bis(acetylacetonato) platinum, among others. Suitable cobalt-containing precursors include cyclopentadienyl cyclohexadienyl cobalt, cyclobutadienyl cyclopentadienyl cobalt, bis(cyclopentadienyl) cobalt, bis(methylcyclopentadienyl) cobalt, cyclopentadienyl (1,3-hexadienyl) cobalt, cyclopentadienyl (5-methylcyclopentadienyl) cobalt, and bis(ethylene) (pentamethylcyclopentadienyl) cobalt, among others. A suitable nickel-containing precursor includes bis(methylcyclopentadienyl) nickel, among others.

Suitable rhodium-containing precursors include bis(propylene) rhodium, bis(carbonyl) (cyclopentadienyl) rhodium, bis (carbonyl) (methylcyclopentadienyl) rhodium, and bis(carbonyl) (ethylcyclopentadienyl) rhodium, among others.

The time interval for the pulse of the noble metal-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the noble metal-containing precursor provides a sufficient amount of precursor so that at least a monolayer of the noble metal-containing precursor is adsorbed on the substrate. Thereafter, excess noble metal-containing precursor remaining in the chamber may be removed from the process chamber by the constant carrier gas stream in combination with the vacuum system.

In step 108, after the excess noble metal-containing precursor has been flushed from the process chamber by the carrier gas stream, a pulse of a reducing gas is added to the carrier gas stream. The pulse of the reducing gas also lasts for a predetermined time interval. In general, the time interval for the pulse of the reducing gas should be long enough for adsorption of at least a monolayer of the reducing gas on the noble metal-containing precursor. Thereafter, excess reducing gas is flushed from the process chamber by the carrier gas stream. Suitable reducing gases may include, for example, silane ($SiH_4$), disilane ($Si_2H_6$), dimethylsilane ($SiC_2H_8$), methyl silane ($SiCH_6$), ethylsilane ($SiC_2H_8$), borane ($BH_3$), diborane ($B_2H_6$), triborane, tetraborane, pentaborane, hexaborane, heptaborane, octaborane, nonaborane, and decaborane, among others.

Steps 104 through 108 comprise one embodiment of a deposition cycle for a noble metal layer. For such an embodiment, a constant flow of carrier gas is provided to the process chamber modulated by alternating periods of pulsing and non-pulsing where the periods of pulsing alternate between the noble metal-containing precursor and the reducing gas along with the carrier gas stream, while the periods of non-pulsing include only the carrier gas stream.

The time interval for each of the pulses of the noble metal-containing precursor and the reducing gas may have the same duration. That is, the duration of the pulse of the noble metal-containing precursor may be identical to the duration of the pulse of the reducing gas. For such an embodiment, a time interval ($T_1$) for the pulse of the noble metal-containing precursor is equal to a time interval ($T_2$) for the pulse of the reducing gas.

Alternatively, the time interval for each of the pulses of the noble metal-containing precursor and the reducing gas may have different durations. That is, the duration of the pulse of the noble metal-containing precursor may be shorter or longer than the duration of the pulse of the reducing gas. For such an embodiment, a time interval ($T_1$) for the pulse of the noble metal-containing precursor is different than the time interval ($T_2$) for the pulse of the reducing gas.

In addition, the periods of non-pulsing between each of the pulses of the noble metal-containing precursor and the reducing gas may have the same duration. That is, the duration of the period of non-pulsing between each pulse of the noble metal-containing precursor and each pulse of the reducing gas is identical. For such an embodiment, a time interval ($T_3$) of non-pulsing between the pulse of the noble metal-containing precursor and the pulse of the reducing gas is equal to a time interval ($T_4$) of non-pulsing between the pulse of the reducing gas and the pulse of the noble metal-containing precursor. During the time periods of non-pulsing only the constant carrier gas stream is provided to the process chamber.

Alternatively, the periods of non-pulsing between each of the pulses of the noble metal-containing precursor and the reducing gas may have different duration. That is, the duration of the period of non-pulsing between each pulse of the noble metal-containing precursor and each pulse of the reducing gas may be shorter or longer than the duration of the period of non-pulsing between each pulse of the reducing gas and the noble metal-containing precursor. For such an embodiment, a time interval ($T_3$) of non-pulsing between the pulse of the noble metal-containing precursor and the pulse of the reducing gas is different from a time interval ($T_4$) of non-pulsing between the pulse of the reducing gas and the pulse of noble metal-containing precursor. During the time periods of non-pulsing only the constant carrier gas stream is provided to the process chamber.

Additionally, the time intervals for each pulse of the noble metal-containing precursor, the reducing gas and the periods of non-pulsing therebetween for each deposition cycle may have the same duration. For such an embodiment, a time interval ($T_1$) for the noble metal-containing precursor, a time interval ($T_2$) for the reducing gas, a time interval ($T_3$) of non-pulsing between the pulse of the noble metal-containing precursor and the pulse of the reducing gas and a time interval ($T_4$) of non-pulsing between the pulse of the reducing gas and the pulse of the noble metal-containing precursor each have the same value for each deposition cycle. For example, in a first deposition cycle ($C_1$), a time interval ($T_1$) for the pulse of the noble metal-containing precursor has the same duration as the time interval ($T_1$) for the pulse of the noble metal-containing precursor in subsequent deposition cycles ($C_2 \ldots C_N$). Similarly, the duration of each pulse of the reducing gas and the periods of non-pulsing between the pulse of the noble metal-containing precursor and the reducing gas in the first deposition cycle ($C_1$) is the same as the duration of each pulse of the reducing gas and the periods of non-pulsing between the pulse of the noble metal-containing precursor and the reducing gas in subsequent deposition cycles ($C_2 \ldots C_N$), respectively.

Alternatively, the time intervals for at least one pulse of the noble metal-containing precursor, the reducing gas and the periods of non-pulsing therebetween for one or more of the deposition cycles of the noble metal layer deposition process may have different durations. For such an embodiment, one or more of the time intervals ($T_1$) for the pulses of the noble metal-containing precursor, the time intervals ($T_2$) for the pulses of the reducing gas, the time intervals ($T_3$) of non-pulsing between the pulse of the noble metal-containing precursor and the reducing gas and the time intervals ($T_4$) of non-pulsing between the pulses of the reducing gas and the noble metal-containing precursor may have different values for one or more deposition cycles of the cyclical deposition process. For example, in a first deposition cycle ($C_1$), the time interval ($T_1$) for the pulse of the noble metal-containing precursor may be longer or shorter than one or more time interval ($T_1$) for the pulse of the noble metal-containing precursor in subsequent deposition cycles ($C_2 \ldots C_N$). Similarly, the durations of the pulses of the reducing gas and the periods of non-pulsing between the pulse of the noble metal-containing precursor and the reducing gas in the first deposition cycle ($C_1$) may be the same or different than the duration of each pulse of the reducing gas and the periods of non-pulsing between the pulse of the noble metal-containing precursor and the reducing gas in subsequent deposition cycles ($C_2 \ldots C_N$).

Referring to step 110, after each deposition cycle (steps 104 through 108) a thickness of the noble metal will be formed on the substrate. Depending on specific device requirements, subsequent deposition cycles may be needed to achieve a desired thickness. As such" steps 104 through 108 are repeated until the desired thickness for the noble metal layer is achieved. Thereafter, when the desired thickness for the noble metal layer is achieved the process is stopped as indicated by step 112.

Figure 3:
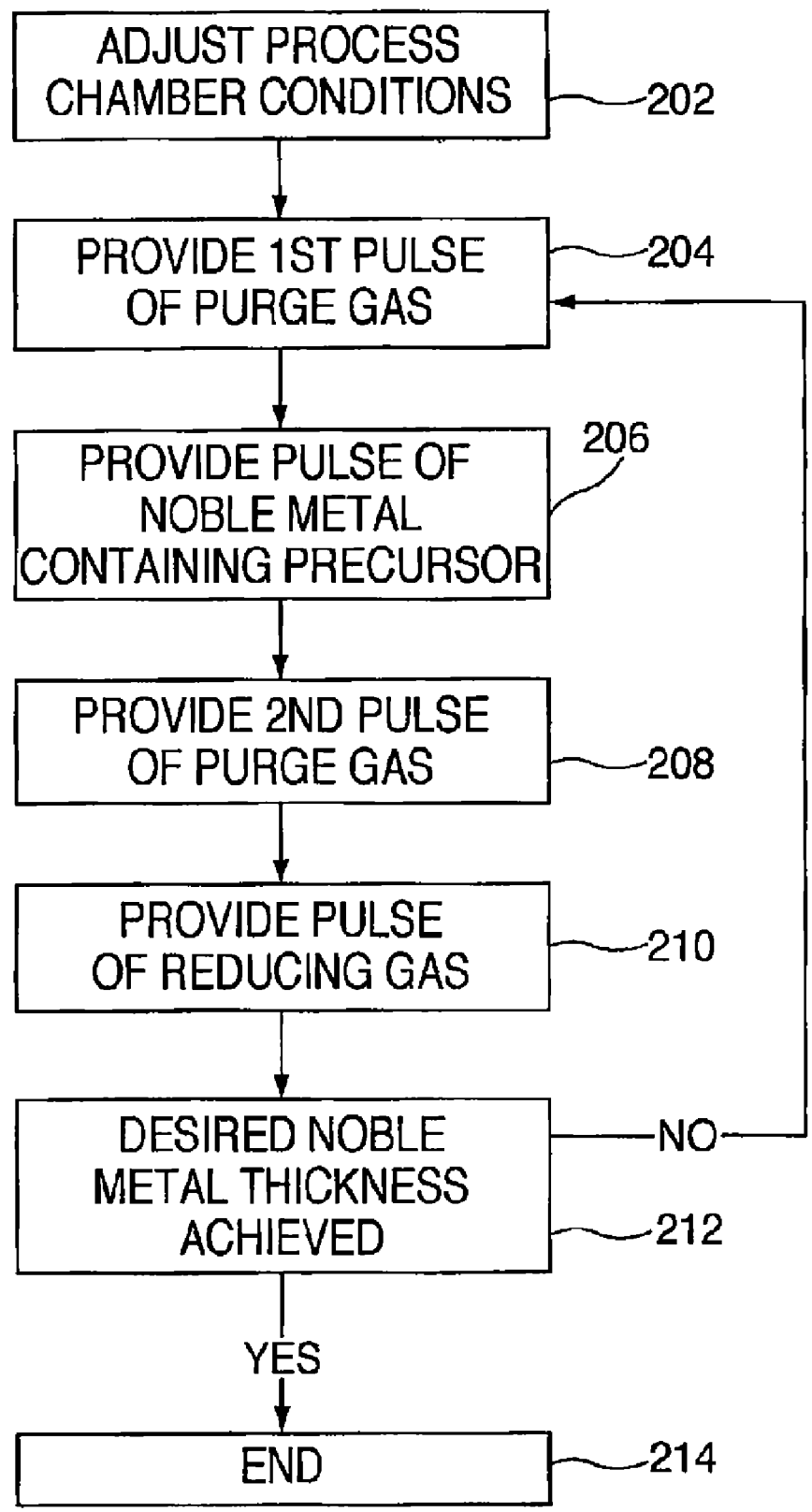
FIG. 3 illustrates a process sequence for noble metal layer formation using cyclical deposition techniques according to an alternate embodiment described herein.

In an alternate process sequence described with respect to FIG. 3, the noble metal layer deposition cycle comprises separate pulses for each of the noble metal-containing precursor, the reducing gas and a purge gas. For such an embodiment, the noble metal layer deposition sequence 200 includes providing a substrate to the process chamber (step 202), providing a first pulse of a purge gas to the process chamber (step 204), providing a pulse of a noble metal-containing precursor to the process chamber (step 206), providing a second pulse of the purge gas to the process chamber (step 208), providing a pulse of a reducing gas to the process chamber (step 210), and then repeating steps 204 through 210, or stopping the deposition process (step 214) depending on whether a desired thickness for the noble metal layer has been achieved (step 212).

The time intervals for each of the pulses of the noble metal-containing precursor, the reducing gas and the purge gas may have the same or different durations as discussed above with respect to FIG. 2. Alternatively, corresponding time intervals for one or more pulses of the noble metal-containing precursor, the reducing gas and the purge gas in one or more of the deposition cycles of the noble metal layer deposition process may have different durations.

In FIGS. 2-3, the noble metal layer deposition cycle is depicted as beginning with a pulse of the noble metal-containing precursor followed by a pulse of the reducing gas. Alternatively, the noble metal layer deposition cycle may start with a pulse of the reducing gas followed by a pulse of the noble metal-containing precursor.

One exemplary process of depositing a noble metal layer comprises sequentially providing pulses of (cyclopentadienyl)(allyl)palladium and pulses of diborane ($B_2H_6$). The (cyclopentadienyl)(allyl)palladium may be provided to an appropriate flow control valve, for example, an electronic control valve, at a flow rate between about 0.01 sccm (standard cubic centimeters per minute) to about 5 sccm, preferably between about 0.1 sccm to about 1 sccm, and thereafter pulsed for about 5 seconds or less, preferably about 1 second or less. The diborane ($B_2H_6$) may be provided to an appropriate flow control valve, for example, an electronic flow control valve at a flow rate between about 1 sccm to about 80 sccm, preferably between about 10 sccm to about 50 seem, and thereafter pulsed for about 10 seconds or less, preferably about 2 seconds or less. The substrate may be maintained at a temperature less than about 250° C., preferably about 180° C. at a chamber pressure between about 1 Torr to about 10 Torr, preferably about 4 Torr.

Formation of Copper Interconnects

Figure 4A:
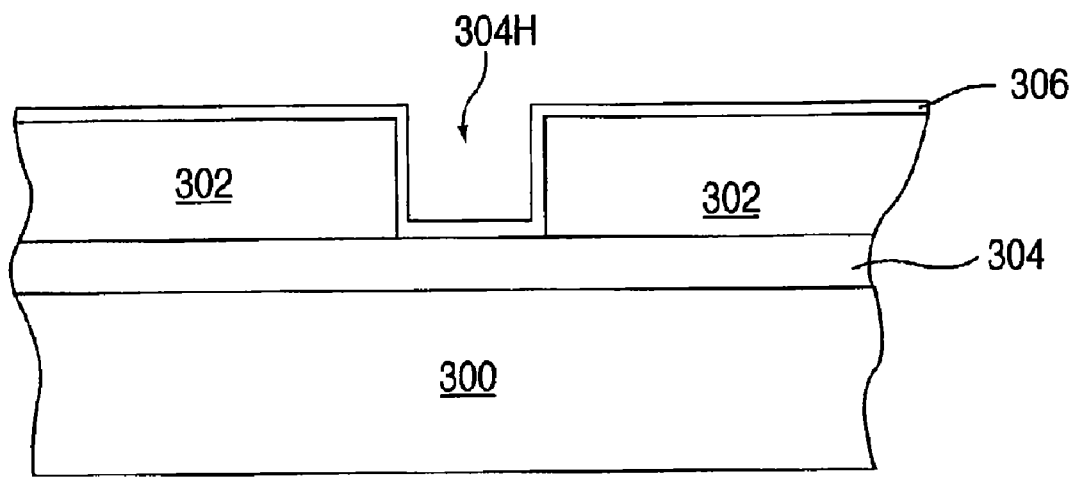
FIGS. 4A-4C illustrate schematic cross-sectional views of an integrated circuit fabrication sequence.
Figure 4B:
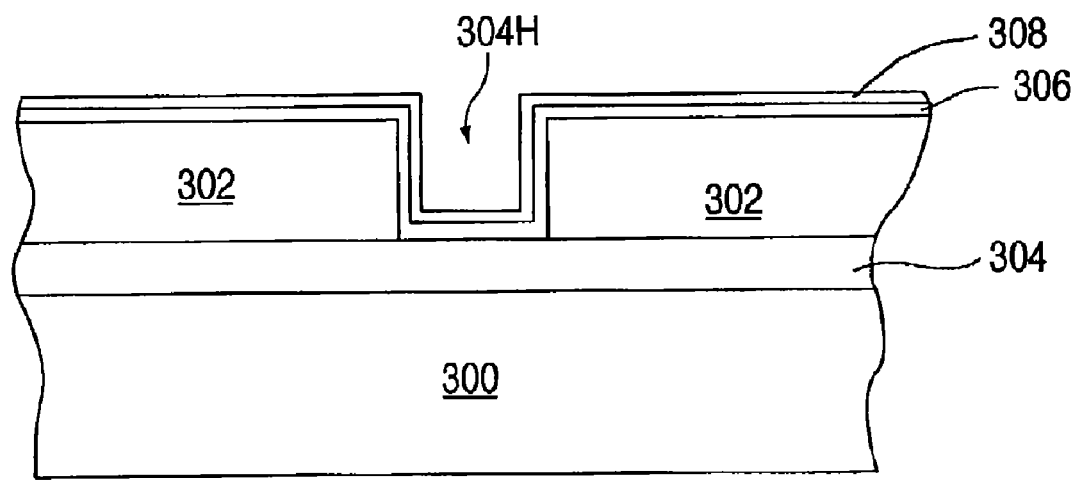
Figure 4C:
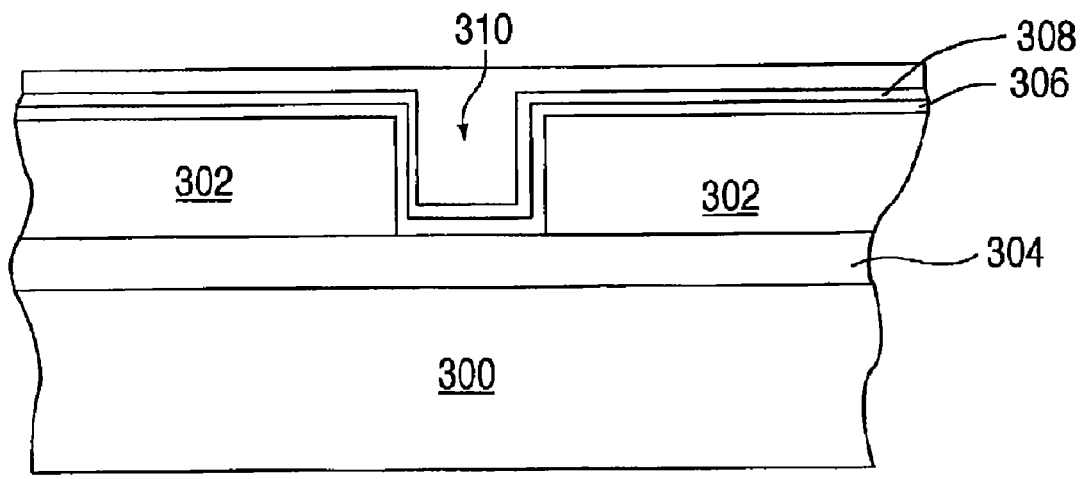

FIGS. 4A-4C illustrate cross-sectional views of a substrate at different stages of a copper interconnect fabrication sequence incorporating the noble metal layer of the present invention. FIG. 4A, for example, illustrates a cross-sectional view of a substrate 300 having metal contacts 304 and a dielectric layer 302 formed thereon. The substrate 300 may comprise a semiconductor material such as, for example, silicon, germanium, or gallium arsenide. The dielectric layer 302 may comprise an insulating material such as, for example, silicon oxide or silicon nitride, among others. The metal contacts 304 may comprise for example, copper, among others. Apertures 304H may be defined in the dielectric layer 302 to provide openings over the metal contacts 304. The apertures 304H may be defined in the dielectric layer 302 using conventional lithography and etching techniques.

A barrier layer 306 may be formed in the apertures 304H defined in the dielectric layer 302. The barrier layer 306 may include one or more refractory metal-containing layers such as, for example, titanium, titanium nitride, tantalum, tantalum nitride, tungsten, and tungsten nitride, among others. The barrier layer 306 may be formed using a suitable deposition process. For example, titanium nitride may be deposited using a chemical vapor deposition process wherein titanium tetrachloride and ammonia are reacted.

Referring to FIG. 4B a noble metal layer 308 is formed on the barrier layer. The noble metal layer is formed using the cyclical deposition techniques described above with reference to FIGS. 2-3. The thickness for the noble metal layer is variable depending on the device structure to be fabricated. Typically, the thickness for the noble metal layer is less than about 100 Å, preferably between about 25 Å to about 60 Å.

Thereafter, referring to FIG. 4C, the apertures 304H may be filled with copper 310 to complete the copper interconnect. The copper 310 may be formed using one or more suitable deposition processes. For example, a copper seed layer may be formed on the noble metal layer using an electrochemical plating (ECP) process followed by deposition of bulk copper to fill the interconnects using a chemical vapor deposition (CVD) process.

While the foregoing is directed to embodiments of the present invention, other and further embodiments of the invention may be devised without departing from the basic scope thereof, and the scope thereof is determined by the claims that follow.

The invention claimed is:

1. A method for forming an interconnect structure on a substrate surface within a processing chamber, comprising:
   depositing a tungsten-containing barrier layer over an exposed contact metal surface within an aperture formed in an insulating material disposed on a substrate;
   forming a cobalt-containing layer on the tungsten-containing barrier layer using a cyclical deposition process by sequentially exposing the substrate to a cobalt precursor gas and a silicon reducing gas, wherein the cobalt precursor gas comprises a cobalt precursor selected from the group consisting of cyclopentadienyl cyclohexadienyl cobalt, cyclobutadienyl cyclopentadienyl cobalt, bis(cyclopentadienyl) cobalt, cyclopentadienyl 1,3-hexadienyl cobalt, and cyclopentadienyl 5-methylcyclopentadienyl cobalt; and
   depositing a copper material on the cobalt-containing layer.

2. The method of claim 1, wherein the silicon reducing gas comprises silane or disilane.

3. The method of claim 2, wherein the cobalt-containing layer has a thickness of less than about 100 Å.

4. The method of claim 1, wherein the cyclical deposition process includes a plurality of cycles and each cycle comprises establishing a flow of a carrier gas within the processing chamber and sequentially pulsing the cobalt precursor gas and the silicon reducing gas into the carrier gas.

5. The method of claim 1, wherein the copper material comprises a seed layer and a bulk layer.

6. The method of claim 5, wherein the seed layer is deposited by an electrochemical plating process and the bulk layer is deposited by a chemical vapor deposition process.

7. The method of claim 1, wherein the copper material is deposited on the cobalt-containing layer by an electrochemical plating process.

8. The method of claim 1, wherein the tungsten-containing barrier layer comprises a material selected from the group consisting of metallic tungsten, tungsten nitride, and combinations thereof.

9. A method for forming an interconnect structure on a substrate surface within a processing chamber, comprising:
    depositing a tungsten-containing barrier layer over an exposed contact metal surface within an aperture formed in an insulating material disposed on a substrate;
    forming a cobalt-containing layer on the tungsten-containing barrier layer using a cyclical deposition process by sequentially exposing the substrate to a cobalt precursor gas and a silicon reducing gas, wherein the cobalt precursor is bis(methylcyclopentadienyl) cobalt or bis(ethylene) pentamethylcyclopentadienyl cobalt; and
    depositing a copper material on the cobalt-containing layer.

10. The method of claim 9, wherein the silicon reducing gas comprises silane or disilane.

11. The method of claim 10, wherein the cyclical deposition process includes a plurality of cycles and each cycle comprises establishing a flow of a carrier gas within the processing chamber and sequentially pulsing the metal precursor gas and the silicon reducing gas into the carrier gas.

12. The method of claim 9, wherein the copper material comprises a seed layer and a bulk layer.

13. The method of claim 12, wherein the seed layer is deposited by an electrochemical plating process and the bulk layer is deposited by a chemical vapor deposition process.

14. The method of claim 9, wherein the copper material is deposited on the metal-containing layer by an electrochemical plating process.

15. The method of claim 9, wherein the tungsten-containing barrier layer comprises a material selected from the group consisting of metallic tungsten, tungsten nitride, and combinations thereof.

16. A method for forming an interconnect structure on a substrate surface within a processing chamber, comprising:
    depositing a metal-containing barrier layer over an exposed contact metal surface within an aperture formed in an insulating material disposed on a substrate;
    forming a cobalt-containing layer on the metal-containing barrier layer using a cyclical deposition process by sequentially exposing the substrate to a cobalt precursor gas and a silicon reducing gas, wherein the cobalt precursor gas comprises a cobalt precursor selected from the group consisting of cyclopentadienyl cyclohexadienyl cobalt, cyclobutadienyl cyclopentadienyl cobalt, bis(cyclopentadienyl) cobalt, cyclopentadienyl 1,3-hexadienyl cobalt, and cyclopentadienyl 5-methylcyclopentadienyl cobalt; and
    depositing a copper material on the cobalt-containing layer.

17. The method of claim 16, wherein the silicon reducing gas comprises silane or disilane.

18. The method of claim 16, wherein the metal-containing barrier layer comprises a material selected from the group consisting of metallic titanium, titanium nitride, metallic tantalum, tantalum nitride, metallic tungsten, tungsten nitride, and combinations thereof.

19. The method of claim 18, wherein the copper material comprises a seed layer deposited by an electrochemical plating process and a bulk layer deposited by a chemical vapor deposition process.

* * * * *